United States Patent
Inaba et al.

(10) Patent No.: US 9,590,622 B1
(45) Date of Patent: Mar. 7, 2017

(54) SEMICONDUCTOR MODULE

(71) Applicant: FUJI ELECTRIC CO., LTD., Kawasaki-shi, Kanagawa (JP)

(72) Inventors: Tetsuya Inaba, Matsumoto (JP); Yoshinari Ikeda, Matsumoto (JP); Katsumi Taniguchi, Matsumoto (JP); Daisuke Kimijima, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/200,847

(22) Filed: Jul. 1, 2016

(30) Foreign Application Priority Data

Aug. 13, 2015 (JP) ................................. 2015-159813

(51) Int. Cl.
*H03K 17/687* (2006.01)
*H01L 29/16* (2006.01)
*H01L 23/373* (2006.01)
*H01L 23/367* (2006.01)
*H01L 25/07* (2006.01)
*H01L 29/861* (2006.01)
*H01L 23/528* (2006.01)

(52) U.S. Cl.
CPC ....... *H03K 17/687* (2013.01); *H01L 23/3675* (2013.01); *H01L 23/3736* (2013.01); *H01L 23/528* (2013.01); *H01L 25/074* (2013.01); *H01L 29/1608* (2013.01); *H01L 29/861* (2013.01); *H01L 2225/06589* (2013.01)

(58) Field of Classification Search
CPC . H01L 23/5227; H01L 23/5283; H01L 23/15; H01L 23/4924; H01L 23/3142; H03L 7/687

USPC ......... 327/434, 427, 437, 108–112; 257/329, 257/77, 532; 363/132
See application file for complete search history.

(56) References Cited

U.S. PATENT DOCUMENTS

| | | | | |
|---|---|---|---|---|
| 5,671,134 | A * | 9/1997 | Nomura ................ | H02M 7/003 363/132 |
| 8,228,113 | B2 * | 7/2012 | Domes .................... | H01L 24/49 327/427 |
| 2013/0277800 | A1 * | 10/2013 | Hori ........................ | H01L 28/40 257/532 |
| 2015/0279753 | A1 * | 10/2015 | Inaba ..................... | H01L 23/049 257/77 |
| 2015/0279983 | A1 * | 10/2015 | Tanaka ................. | H01L 29/7806 257/329 |
| 2016/0093749 | A1 * | 3/2016 | Wada ..................... | H01L 21/046 257/77 |
| 2016/0126187 | A1 * | 5/2016 | Inaba ..................... | H01L 23/15 257/329 |

FOREIGN PATENT DOCUMENTS

| | | |
|---|---|---|
| JP | H07-312410 A | 11/1995 |
| JP | 08-084483 A | 3/1996 |
| JP | 2013-118336 A | 6/2013 |

* cited by examiner

*Primary Examiner* — Lincoln Donovan
*Assistant Examiner* — Thomas Skibinski
(74) *Attorney, Agent, or Firm* — Rabin & Berdo, P.C.

(57) ABSTRACT

In a semiconductor module, second semiconductor chips (e.g., diodes) are disposed closer to a laminated substrate than first semiconductor chips (MOSFETs). When a control signal supplied to gate electrodes of the first semiconductor chips (MOSFETs) is off, an electric current produced by a voltage from source terminals to a drain board mainly flows through the second semiconductor chips.

9 Claims, 13 Drawing Sheets

SEMICONDUCTOR MODULE

CROSS-REFERENCE TO RELATED APPLICATION

This application is based upon and claims the benefit of priority of the prior Japanese Patent Application No. 2015-159813, filed on Aug. 13, 2015, the entire contents of which are incorporated herein by reference.

BACKGROUND OF THE INVENTION

1. Field of the Invention

The embodiment discussed herein relates to a semiconductor module.

2. Background of the Related Art

As one kind of semiconductor devices, semiconductor modules each provided with a plurality of semiconductor elements (switching elements), such as Insulated Gate Bipolar Transistor (IGBT) and power Metal Oxide Semiconductor Field Effect Transistor (MOSFET), are widely used. For example, switching, converting, or another function is implemented by connecting such semiconductor modules in parallel. Among such semiconductor modules, non-insulated semiconductor modules, which do not have an insulating function therein, have low inductance in the internal wiring, compared with insulated semiconductor modules.

A non-insulated semiconductor module has a gate terminal and a source terminal on its upper surface and a drain terminal on its lower surface. In addition, gate and source conductors are disposed together on the upper surface, a drain conductor is disposed on the lower surface, and these conductors are pressure connected from the upper and lower sides, so that the semiconductor module is electrically connected to outside (see, for example, Japanese Laid-open Patent Publication No. 07-312410).

As materials for switching elements, wide-bandgap semiconductor materials such as silicon carbide are used, instead of silicon. These materials enable the switching elements to have high voltage withstanding capability and achieve fast switching.

However, in a switching element made of a wide-bandgap semiconductor material, a body diode (parasitic diode) is internally formed in the switching element. When the switching element is turned off from on, a reverse voltage is applied, so that an electric current flows through the body diode. Therefore, in the case where such a switching element is used in the semiconductor module disclosed in Japanese Laid-open Patent Publication No. 07-312410, the on-resistance of the switching element increases. As a result, the switching element is heated and degraded, and thus the characteristics of the semiconductor module may be degraded.

SUMMARY OF THE INVENTION

According to one aspect, there is provided a semiconductor module including: a drain board having a front surface and a back surface that receives an electric current supplied from outside; a laminated substrate including an insulating plate and a circuit board and being disposed on the front surface of the drain board, the insulating plate having a front surface and a back surface joined to the drain board, the circuit board being disposed on the front surface of the insulating plate; a first semiconductor chip having a gate electrode and a source electrode on a front surface of the first semiconductor chip and a drain electrode on a back surface of the first semiconductor chip and being disposed on the front surface of the drain board, the first semiconductor chip including a switching element made of a wide-bandgap semiconductor, the drain electrode being electrically connected to the drain board; a second semiconductor chip having an anode electrode on a front surface of the second semiconductor chip and a cathode electrode on a back surface of the second semiconductor chip and being disposed between the first semiconductor chip and the laminated substrate on the front surface of the drain board, the second semiconductor chip including a diode element, the cathode electrode being electrically connected to the drain board; a connecting member configured to electrically connect the source electrode of the first semiconductor chip and the circuit board and to electrically connect the anode electrode of the second semiconductor chip and the circuit board; and a source terminal disposed on the circuit board and configured to output the electric current controlled by the first semiconductor chip to the outside.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
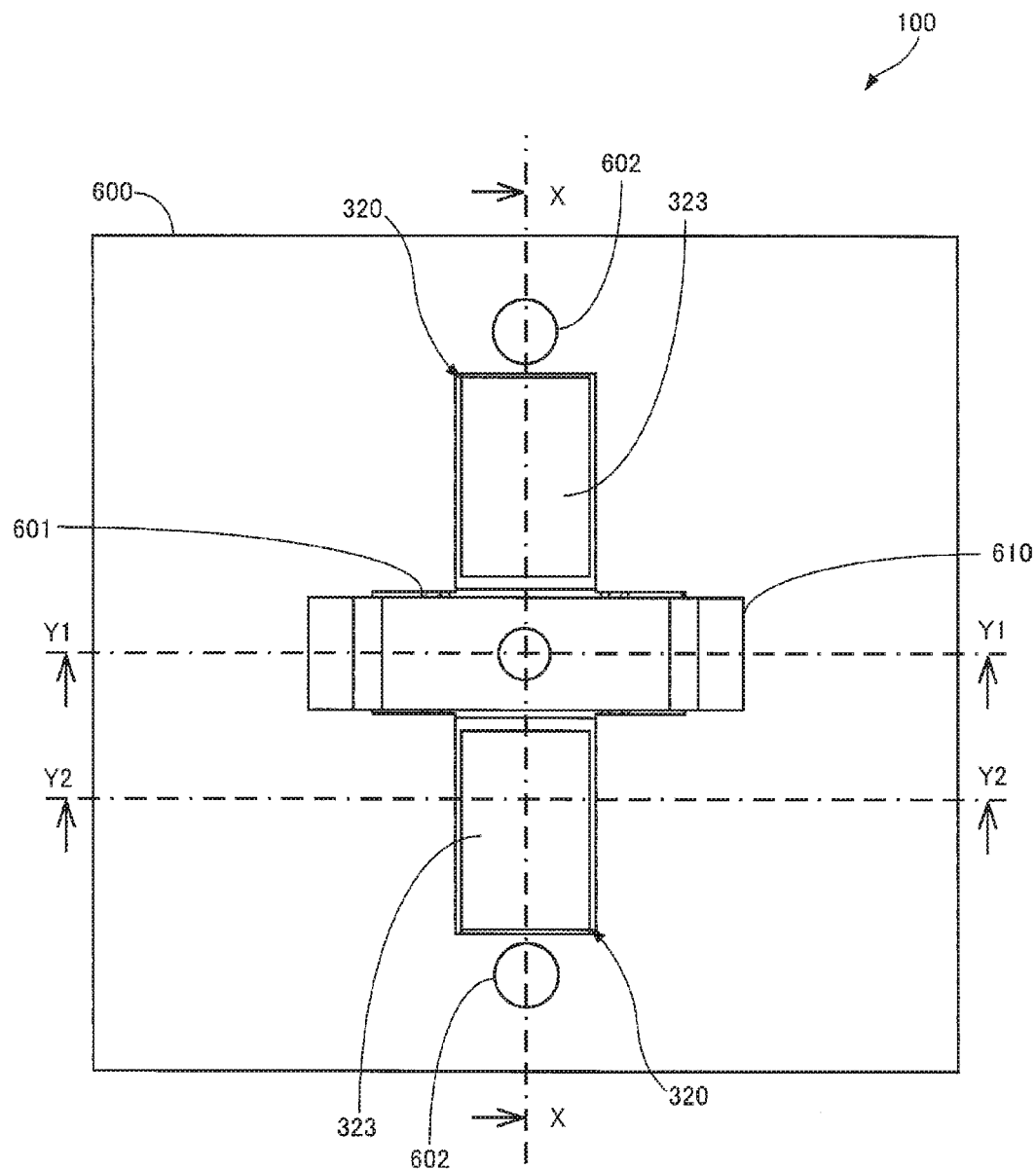
FIG. 1 is a top view of a semiconductor module according to one embodiment.

An embodiment will now be described in detail with reference to the accompanying drawings, wherein like reference numerals refer to like elements throughout.

A semiconductor module of one embodiment will be described with reference to FIGS. 1 to 3.

Figure 2A:
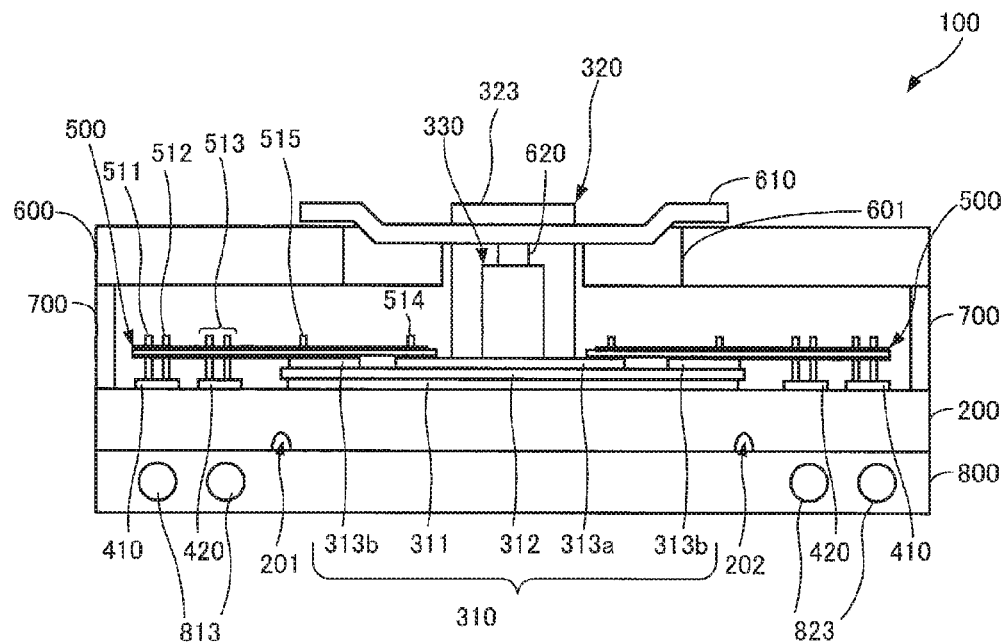
FIGS. 2A and 2B are cross sectional views of the semiconductor module according to the embodiment.
Figure 2B:
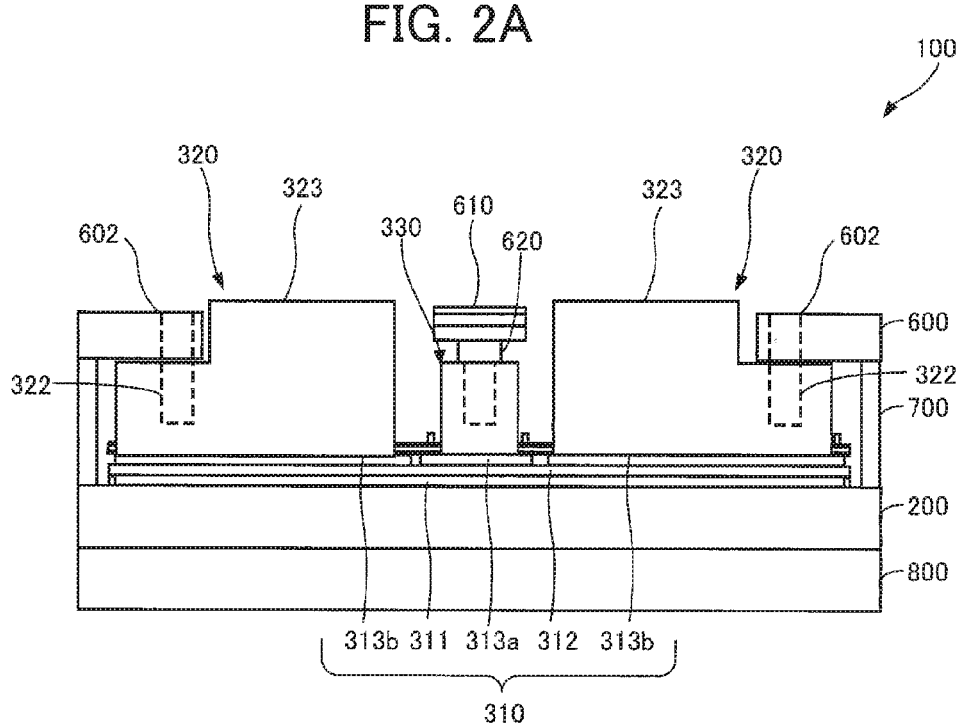

FIG. 1 is a top view of a semiconductor module according to the embodiment. FIGS. 2A and 2B are cross sectional views of the semiconductor module according to the embodiment. More specifically, FIG. 2A is a cross sectional view taken along chain line Y1-Y1 of FIG. 1, and FIG. 2B is a cross sectional view taken along chain line X-X of FIG. 1.

Figure 3:
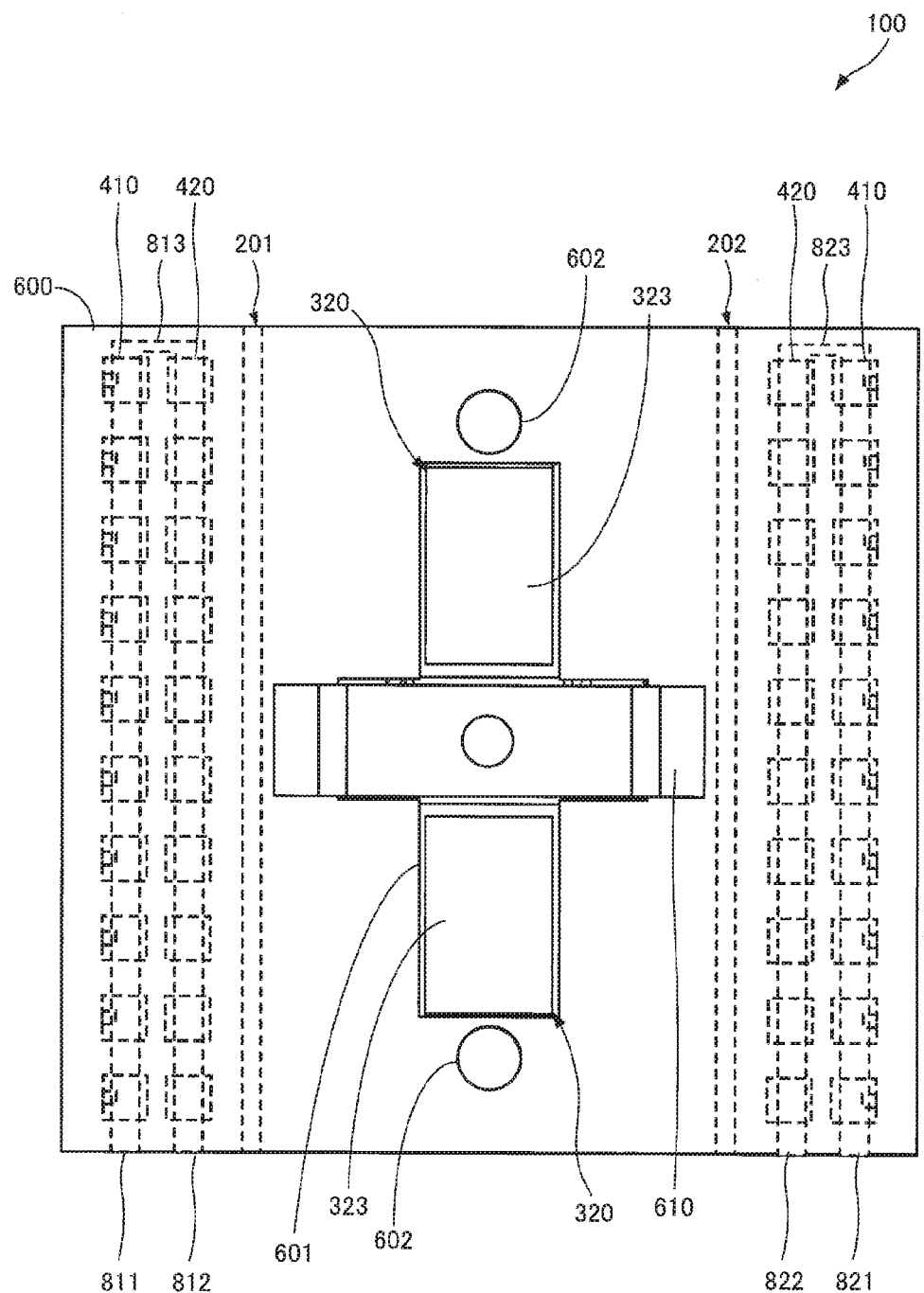
FIG. 3 illustrates the placement of cooling pipes of the semiconductor module according to the embodiment.

FIG. 3 illustrates the placement of cooling pipes of the semiconductor module of the embodiment. FIG. 3 is a top view of the semiconductor module 100, and illustrates the positions of first and second semiconductor chips 410 and 420 and grooves 201 and 202, provided on a drain board 200, by broken lines. The positions of cooling pipes 813 and 823 provided in a cooling device 800 are also illustrated by broken lines.

As illustrated in FIGS. 1, 2A, and 2B, the non-insulated semiconductor module 100 has the drain board 200, and a laminated substrate 310 and first and second semiconductor chips 410 and 420 disposed on the front surface of the drain board 200. Each first semiconductor chip 410 includes a MOSFET, and each second semiconductor chip 420 includes a diode. In the back surface of the drain board 200, the grooves 201 and 202 are formed across the drain board 200. The first and second semiconductor chips 410 and 420 are disposed in peripheral regions of the front surface of the drain board 200, beyond the grooves 201 and 202.

The laminated substrate 310 is formed by laminating a metal plate 311, an insulating plate 312, a gate circuit board 313*a*, and a circuit board 313*b*.

In addition, the semiconductor module 100 has printed circuit boards 500 and conductive posts 511 to 515 that function as connecting members for electrically connecting the first semiconductor chips 410, second semiconductor chips 420, and the laminated substrate 310. A gate terminal 330 is disposed on the gate circuit board 313*a*, and a pair of source terminals 320 is disposed on the circuit board 313*b*. In this connection, a gate contact 610 made of a conductive elastic member is connected to the gate terminal 330 via a gate support 620.

The sides of the semiconductor module 100 configured as above are covered with a case 700, and the upper part of the semiconductor module 100 is covered with a lid 600 having an opening 601 and holes 602. The gate contact 610 and the source terminals 320 are exposed from the opening 601, and the holes 602 are aligned with screw holes 322 of the source terminals 320.

Further, the cooling device 800 is disposed on the back surface of the drain board 200 of the semiconductor module 100. The cooling device 800 is made of metal with good heat conductivity, such as aluminum, gold, silver, or copper. The cooling device 800 has the built-in cooling pipes 813 and 823, as illustrated in FIG. 3. Cooling water is introduced in the cooling pipes 813 and 823 through inlets 811 and 821, and discharged from outlets 812 and 822. The cooling pipes 813 and 823 are positioned under the first and second semiconductor chips 410 and 420 via a compound so as to cool the first and second semiconductor chips 410 and 420.

In the above semiconductor module 100, the positive electrode of an external power source (not illustrated) is connected to the back surface of the cooling device 800, and the negative electrode of the external power source is connected to contact surfaces 323 of the source terminals 320. In addition, in the semiconductor module 100, an external control terminal (not illustrated) is connected to the gate contact 610, and a control signal is supplied from the external control terminal to the gate contact 610.

A flow of an electric current in this case will be described in detail later.

The following describes each part of the semiconductor module 100 with reference to FIGS. 4A to 9.

FIGS. 4A to 9 illustrate the configuration of the semiconductor module according to the embodiment.

Figure 4A:
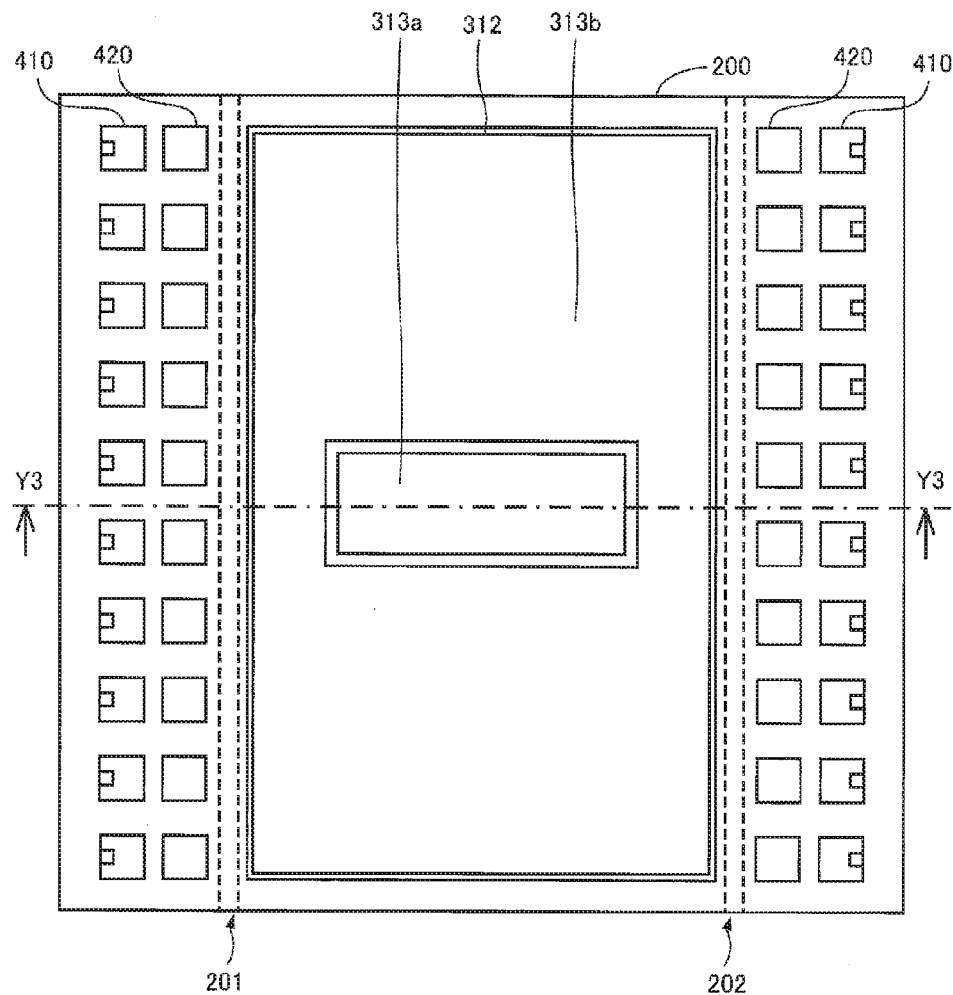
FIGS. 4A and 4B, 5, 6A and 6B, and 7 to 9 illustrate the configuration of the semiconductor module according to the embodiment.
Figure 4B:
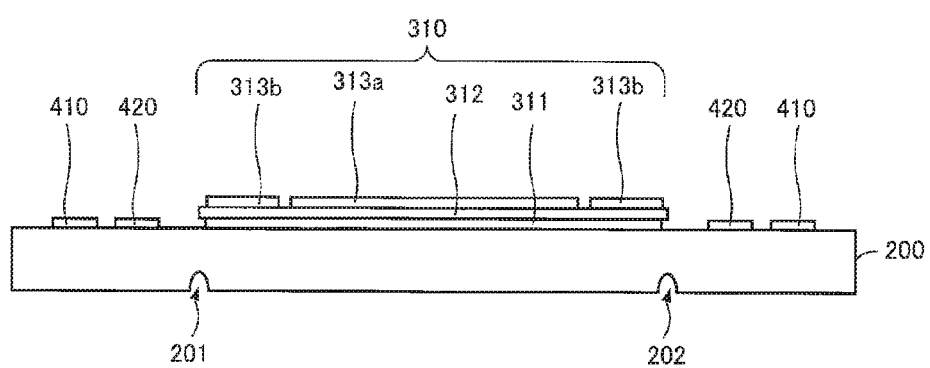
Figure 5:
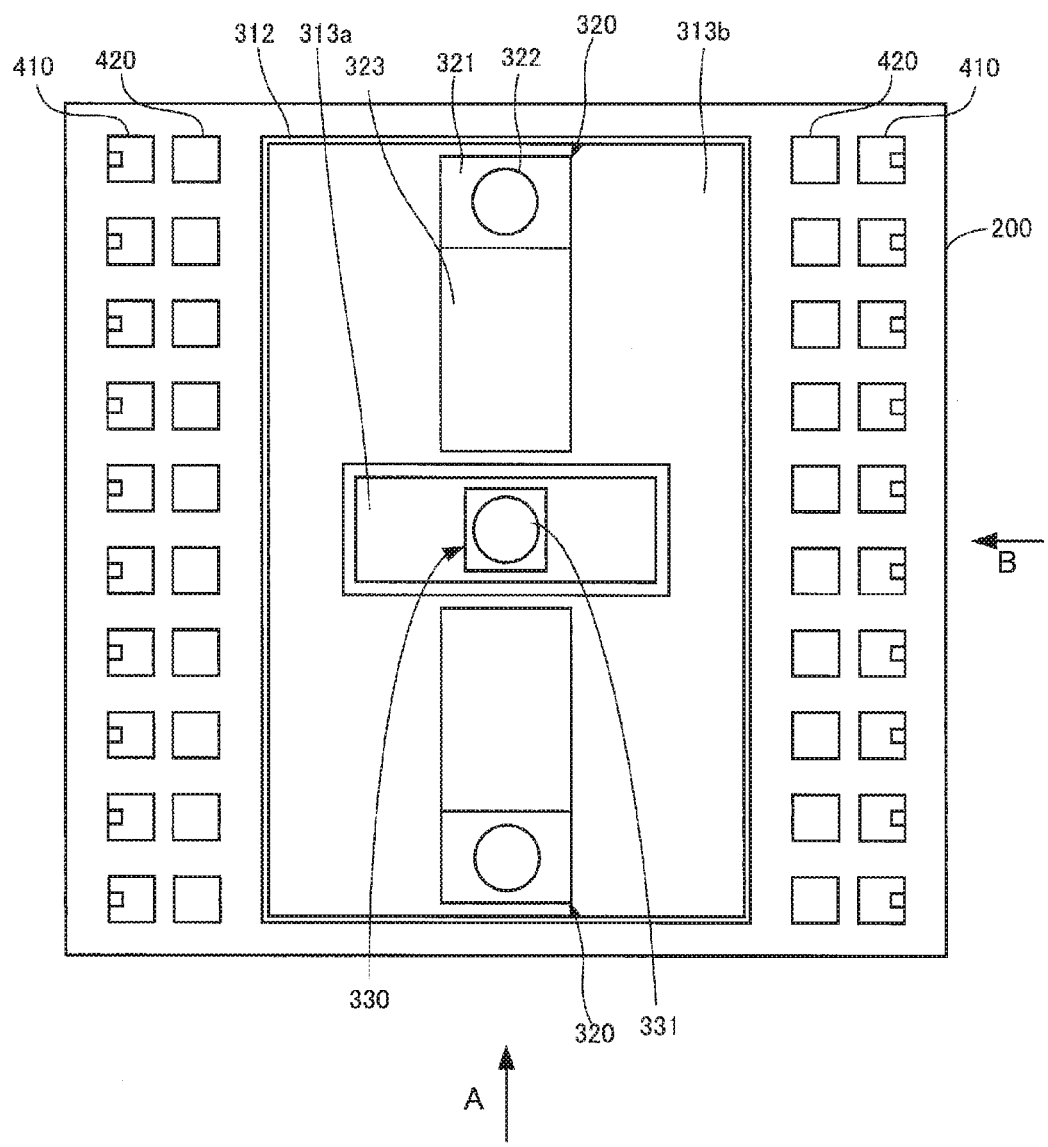
Figure 6A:
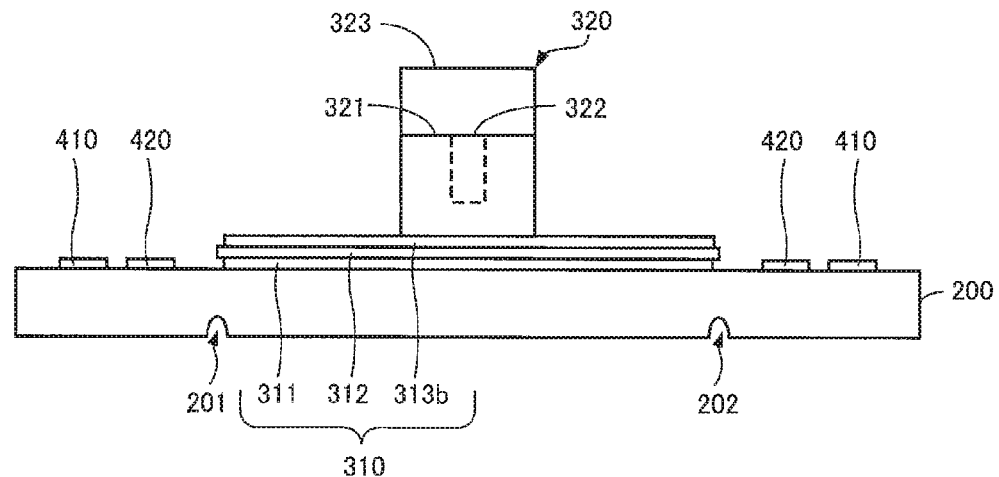
Figure 6B:
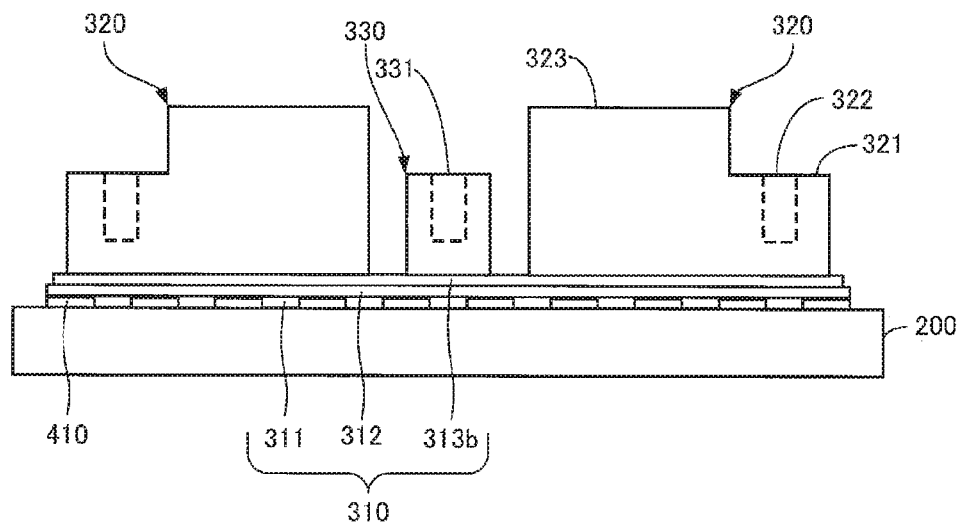

In this connection, FIG. 4B is a cross sectional view taken along chain line Y3-Y3 of FIG. 4A. FIG. 6A is a view as seen from an arrow A of FIG. 5, and FIG. 6B is a view as seen from an arrow B of FIG. 5.

Figure 8:
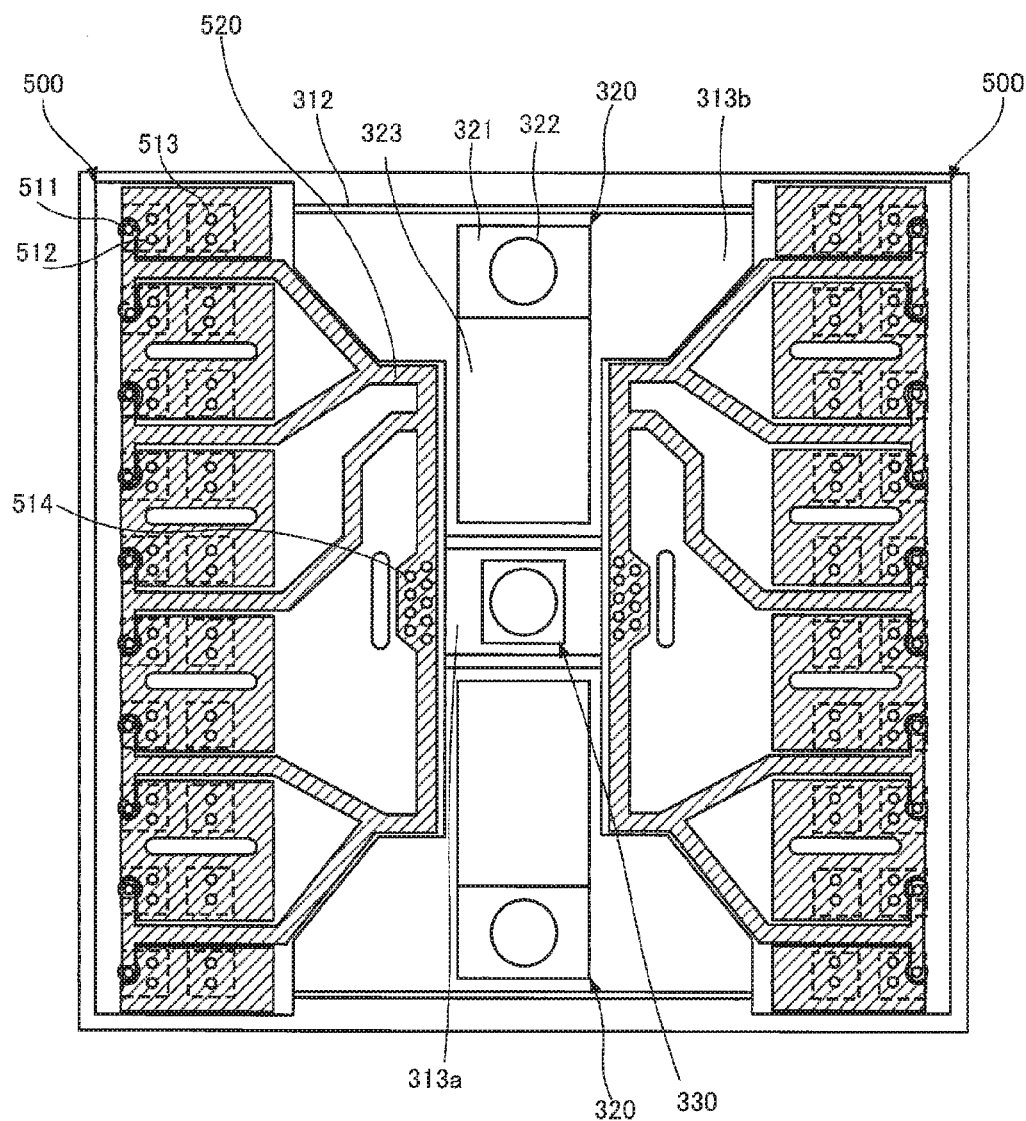
Figure 9:
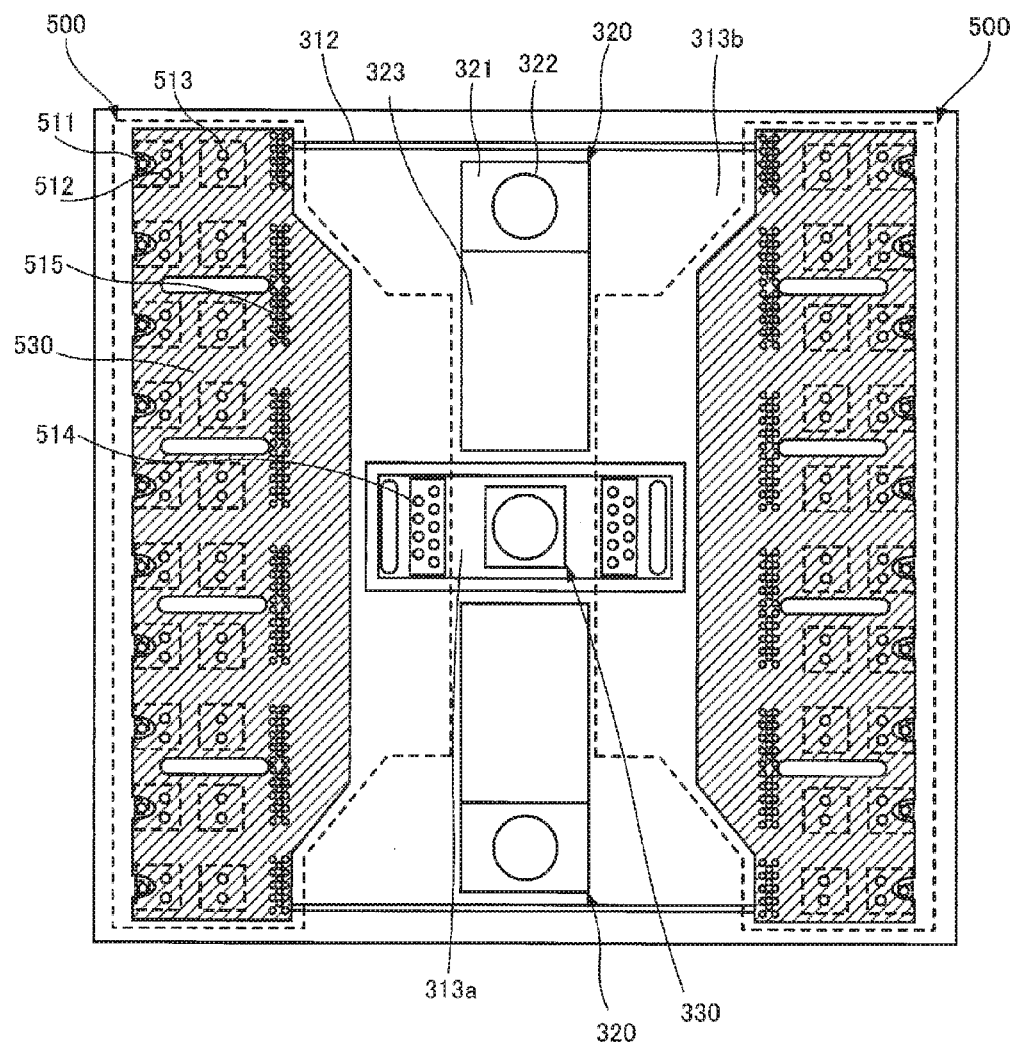

FIG. 8 illustrates a gate wiring layer 520 formed on the front surface of the printed circuit boards 500. FIG. 9 illustrates a source wiring layer 530 formed on the back surface of the printed circuit boards 500.

As illustrated in FIGS. 4A and 4B, the drain board 200 is made of an electrically conductive material, such as copper, and the grooves 201 and 202 are formed across the drain board 200 on the back surface of the drain board 200.

The laminated substrate 310 is, for example, soldered to the central part of the front surface of the drain board 200 between the grooves 201 and 202. The laminated substrate 310 includes the metal plate 311, the insulating plate 312, the gate circuit board 313*a* disposed at the central part of the front surface of the insulating plate 312, and the circuit board 313*b* surrounding the gate circuit board 313*a*. Therefore, the gate circuit board 313*a* and circuit board 313*b* maintain the insulation property.

Each first semiconductor chip 410 includes a power MOSFET fabricated from silicon carbide, which is a wide-bandgap semiconductor. Along with the fabrication of the power MOSFET from silicon carbide, a body diode (parasitic diode) is internally formed together with the power MOSFET in the first semiconductor chip 410. Therefore, in the first semiconductor chip 410, the body diode is connected in anti-parallel to the power MOSFET. A drain electrode is formed on the back surface (facing the drain board 200) of the first semiconductor chip 410, and a source electrode and a gate electrode are formed on the front surface of the first semiconductor chip 410. With respect to the body diode, the back surface of the first semiconductor chip 410 serves as a cathode electrode, and the front surface of the first semiconductor chip 410 serves as an anode electrode. In addition, for example, such first semiconductor chips 410 are linearly arranged in two lines along the periphery on the front surface of the drain board 200. Each line includes ten chips, for example. The first semiconductor chips 410 are, for example, soldered to the drain board 200, so that the drain electrodes are electrically connected to the drain board 200.

Each second semiconductor chip 420 includes a diode. A cathode electrode is formed on the back surface (facing the drain board 200) of the second semiconductor chip 420, and an anode electrode is formed on the front surface of the second semiconductor chip 420. Such second semiconductor chips 420 are arranged between the first semiconductor chips 410 and the laminated substrate 310 on the front surface of the drain board 200. For example, similarly to the first semiconductor chips 410, the second semiconductor chips 420 are linearly arranged in two lines, each of which includes ten chips. The second semiconductor chips 420 are, for example, soldered to the drain board 200, so that the cathode electrodes are electrically connected to the drain board 200.

In this connection, the first and second semiconductor chips 410 and 420 are disposed in peripheral regions of the drain board 200, beyond the grooves 201 and 202. In addition, a compound is applied to the peripheral regions of the back surface of the drain board 200, beyond the grooves 201 and 202, in order to improve cooling efficiency.

Moreover, a pair of source terminals 320 is disposed on the circuit board 313*b* of the laminated substrate 310, as shown in FIGS. 5, 6A, and 6B, and are electrically connected thereto. For example, each source terminal 320 is column-shaped, and has a step surface 321 with a screw hole 322 and a contact surface 323 to which an external connection terminal is to be connected.

In addition, the gate terminal 330 is, for example, soldered to the gate circuit board 313*a* of the laminated substrate 310 so as to be electrically connected thereto. The gate terminal 330 has an engagement hole 331, with which the above-described gate support 620 is engaged.

The pair of source terminals 320 and the gate terminal 330 are linearly arranged on the laminated substrate 310.

Figure 7:
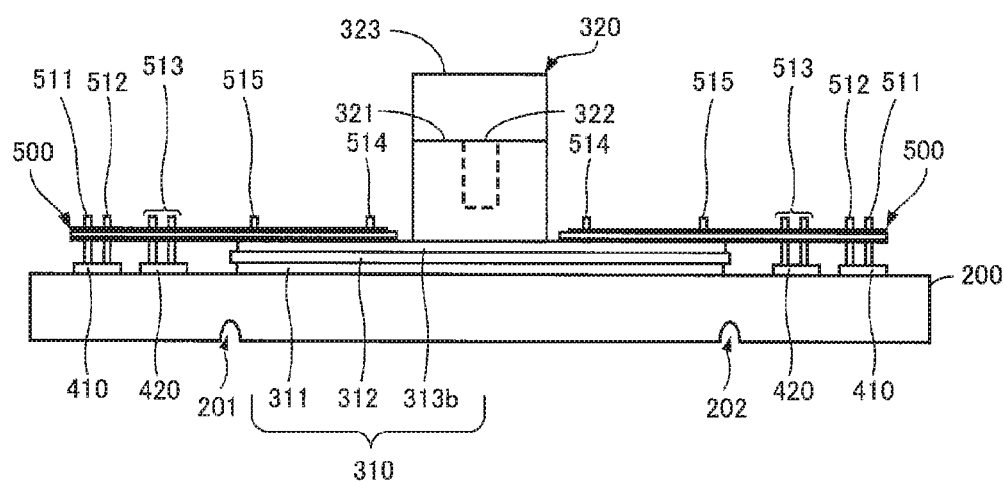

Further, as illustrated in FIGS. 7 to 9, the first semiconductor chips 410 and second semiconductor chips 420 are electrically connected to the laminated substrate 310 (gate circuit board 313a and circuit board 313b) via connecting members (printed circuit boards 500 and conductive posts 511 to 515).

The gate wiring layer 520 is formed on the front surface of the printed circuit boards 500, especially as illustrated in FIG. 8. The gate wiring layer 520 provides an electrical connection between the conductive posts 514 and the conductive posts 511. In addition, the conductive posts 514 are electrically connected to the gate circuit board 313a, and the conductive posts 511 are electrically connected to the gate electrodes of the first semiconductor chips 410 (MOSFETs). Still further, the gate wiring layer 520 is electrically connected to the gate terminal 330 via the gate circuit board 313a. Therefore, the gate terminal 330 is electrically connected to the gate electrodes of the first semiconductor chips 410 via the above members.

In addition, the source wiring layer 530 is formed on the back surface of the printed circuit boards 500, for example as illustrated in FIG. 9. The source wiring layer 530 provides an electrical connection between the conductive posts 515, the conductive posts 512, and the conductive posts 513. In addition, the conductive posts 515 are electrically connected to the circuit board 313b, and the conductive posts 512 are electrically connected to the source electrodes of the first semiconductor chips 410 (MOSFETs), and the conductive posts 513 are electrically connected to the anode electrodes of the second semiconductor chips 420 (diodes). Still further, the source wiring layer 530 is electrically connected to the source terminals 320 via the circuit board 313b. Therefore, the source terminals 320, the source electrodes of the first semiconductor chips 410, and the anode electrodes of the second semiconductor chips 420 are electrically connected to each other via the above members.

The periphery of the above semiconductor module 100 is covered with the case 700, as illustrated in FIGS. 1, 2A, and 2B. In addition, the lid 600 is attached to the top such that the source terminals 320 and gate terminal 300 are exposed from the opening 601 of the lid 600 and the holes 602 of the lid 600 are aligned with the screw holes 322 of the source terminals 320. In addition, the gate support 620 having the gate contact 610 attached thereto is engaged with the engagement hole 331 of the gate terminal 330. In this way, the semiconductor module 100 is produced. In addition, the cooling device 800 is attached to the back surface of the drain board 200, as illustrated in FIG. 3.

Figure 10:
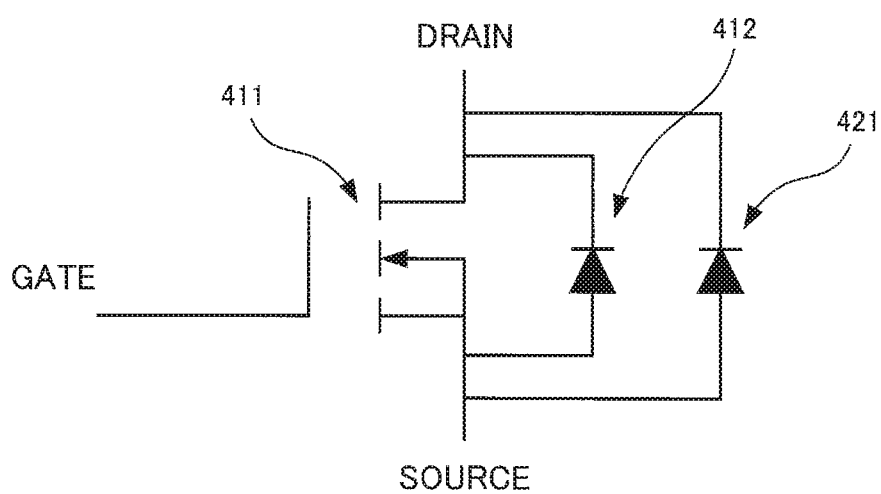
FIG. 10 illustrates a circuit configuration formed by the semiconductor module of the embodiment.

The following describes a circuit configuration of the produced semiconductor module 100 with reference to FIG. 10.

FIG. 10 illustrates a circuit configuration formed by the semiconductor module of the embodiment.

As illustrated in FIG. 10, in the semiconductor module 100, a diode 421 (a second semiconductor chip 420) is connected in anti-parallel to a MOSFET 411 (a first semiconductor chip 410). In addition, a body diode 412 that is internally formed in the first semiconductor chip 410 is connected in anti-parallel to the MOSFET 411.

Figure 11A:
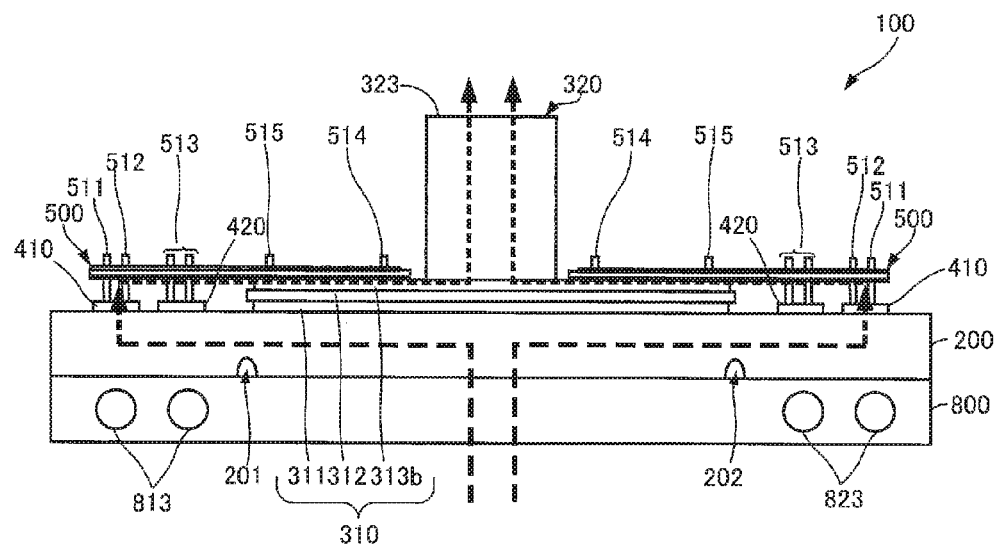
FIGS. 11A and 11B each illustrate how an electric current flows in the semiconductor module of the embodiment.
Figure 11B:
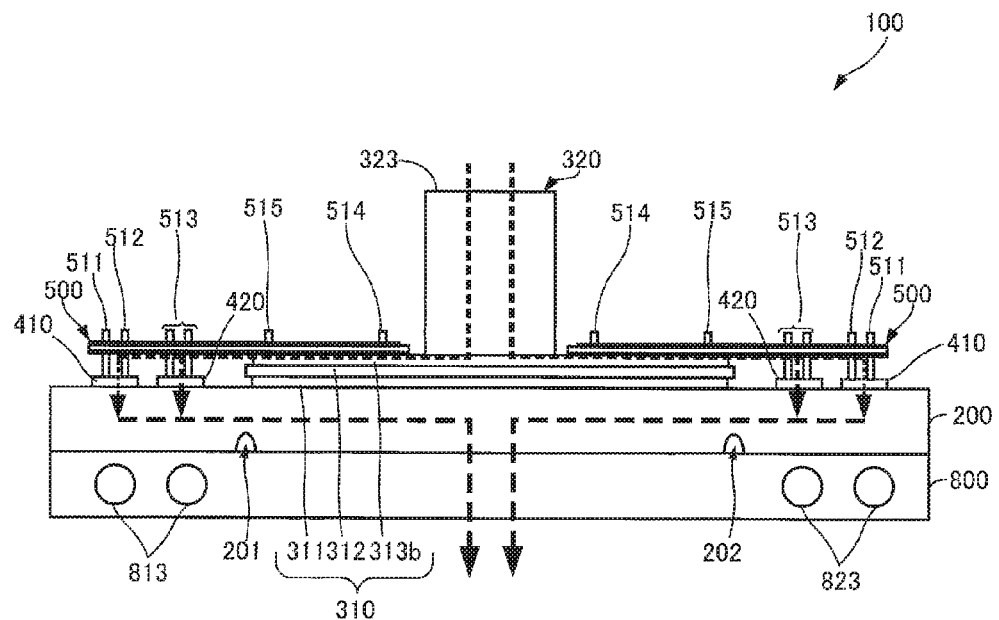

The following describes a flow of an electric current in the semiconductor module 100 with reference to FIGS. 11A and 11B.

FIGS. 11A and 11B each illustrate how an electric current flows in the semiconductor module of the embodiment.

FIGS. 11A and 11B do not illustrate the case 700 or lid 600, but illustrate a configuration related to the flow of an electric current. FIGS. 11A and 11B are cross-sectional views taken along chain line Y2-Y2 of FIG. 1. FIG. 11A illustrates, with broken lines, how an electric current flows when the gates of the first semiconductor chips 410 (MOSFETs) are on. FIG. 11B illustrates, with broken lines, how an electric current flows immediately after the gates of the first semiconductor chips 410 (MOSFETs) are turned off.

In the semiconductor module 100, the positive electrode of an external power source (not illustrated) is connected to the back surface of the cooling device 800, and the negative electrode of the external power source is connected to the contact surfaces 323 of the source terminals 320. An electric current supplied through the cooling device 800 enters the central part of the back surface of the drain board 200 between the groves 201 and 202 formed in the back surface of the drain board 200. This is because a cooling compound is applied to the peripheral regions of the back surface of the drain board 200, beyond the grooves 201 and 202, so that these peripheral regions of the back surface are not electrically conductive. In addition, in the semiconductor module 100, an external control terminal (not illustrated) is connected to the gate contact 610, and a control signal is input from the external control terminal to the gate contact 610.

When a control signal is supplied from the external control terminal connected to the gate contact 610, the control signal is input to the gate electrodes of the first semiconductor chips 410 (MOSFETs) via the gate terminal 330, gate circuit board 313a, conductive posts 514, gate wiring layer 520 of the printed circuit boards 500, and conductive posts 511.

At this time, the electric current supplied through the cooling device 800 enters the central part (between the grooves 201 and 202) of the back surface of the drain board 200, as illustrated in FIG. 11A. Then, the electric current flows toward the periphery of the drain board 200, detouring the laminated substrate 310. The second semiconductor chips 420 (diodes) each have a cathode electrode on its back surface (facing the drain board 200) and an anode electrode on its front surface. Therefore, the electric current flowing toward the periphery of the drain board 200 does not enter the second semiconductor chips 420 (diodes) but enters the drain electrodes of the first semiconductor chips 410 (MOSFETs). In the first semiconductor chips 410 (MOSFETs), the electric current enters the drain electrodes because the gate electrodes are in the ON state, and then the electric current (source current) exits from the source electrode formed on the front surface. The electric current that exits from the first semiconductor chips 410 (MOSFETs) in this way is output to outside from the source terminals 320 via the conductive posts 512, the source wiring layer 530 of the printed circuit boards 500, the conductive posts 515, and circuit board 313b.

Then, when the control signal supplied to the gate electrodes of the first semiconductor chips 410 (MOSFET) is turned off, the voltage from the drain board 200 to the source terminals 320 reverses its direction in the semiconductor module 100. That is, a voltage from the source terminals 320 to the drain board 200 is applied, and therefore, the electric current starts to flow in the reverse-voltage direction, as illustrated in FIG. 11B. More specifically, the electric current from the source terminals 320 flows through the source wiring layer 530 of the printed circuit boards 500 via the circuit board 313b and the conductive posts 515 immediately after the gates of the first semiconductor chips 410 are turned off.

Note that, in this embodiment, the second semiconductor chips 420 are arranged closer to the laminated substrate 310 (upstream side of the electric current) than the first semiconductor chips 410. Therefore, the electric current flowing through the source wiring layer 530 of the printed circuit boards 500 mainly enters the second semiconductor chips 420 (diodes 421), not the body diodes 412 of the first semiconductor chips 410.

Therefore, it is possible to reduce the electric current to enter the first semiconductor chips 410. When the electric current that enters the first semiconductor chips 410 is reduced, less electric current enters the body diodes 412 of the first semiconductor chips 410 accordingly. This leads to a reduction in heat generation of the first semiconductor chips 410 and thus to minimizing degradation in the characteristics of the semiconductor module 100.

In addition, in the case where the resistance of the diodes 421 of the second semiconductor chips 420 is made smaller than that of the body diodes 412 of the first semiconductor chips 410, the electric current flowing through the source wiring layer 530 flows easily to the second semiconductor chips 420. Therefore, this case achieves a much better effect.

Figure 12:
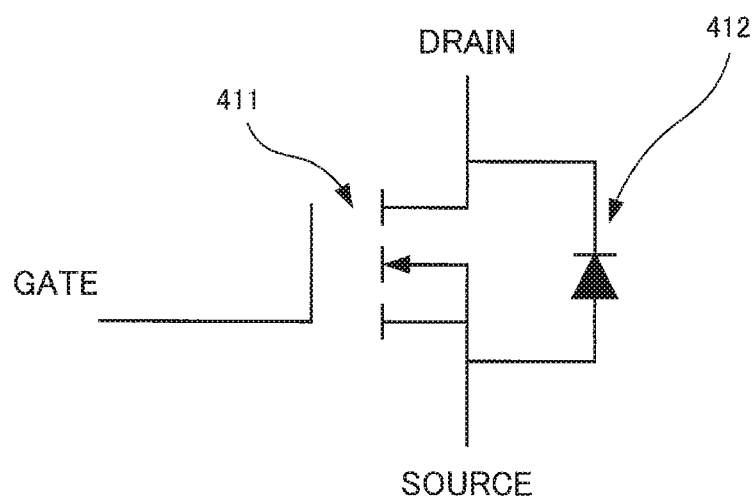
FIG. 12 illustrates a circuit configuration formed by a semiconductor module as a reference example.
Figure 13:
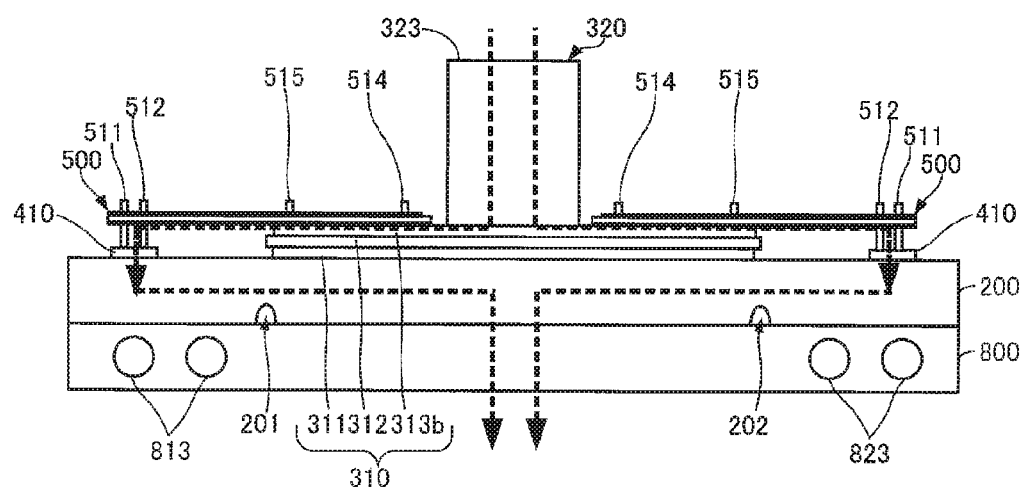
FIG. 13 illustrates how an electric current flows in the semiconductor module as the reference example.

As a reference example for comparison with the above semiconductor module 100, the following describes a semiconductor module configured without second semiconductor elements 420 (diodes), with reference to FIGS. 12 and 13.

This semiconductor module is not provided with the second semiconductor chips 420 (diodes), but the other configuration thereof is the same as the configuration of the semiconductor module 100 (FIGS. 1 to 3). In the following, the configuration of the semiconductor module will be described with the same reference numerals as used above, and the same explanation will be omitted.

FIG. 12 illustrates a circuit configuration formed by a semiconductor module as a reference example. FIG. 13 illustrates how an electric current flows in the semiconductor module as the reference example.

Similarly to FIG. 11B, FIG. 13 is a cross sectional view taken along chain line Y2-Y2 of FIG. 1. In this figure, a case 700, lid 600, and others are not illustrated, and only a partial configuration related to a flow of an electric current is illustrated. In addition, FIG. 13 illustrates, with chain lines, how an electric current flows immediately after the gates of the first semiconductor chips 410 are turned off.

In the circuit configuration of the semiconductor module of the reference example, a body diode 412 is connected in anti-parallel to a MOSFET 411, as illustrated in FIG. 12.

In this semiconductor module of the reference example, when a control signal supplied to the gate electrodes of the first semiconductor chips 410 (MOSFETs) is turned off, the voltage from a drain board 200 to source terminals 320 reverses its direction. That is, as illustrated in FIG. 13, the electric current starts to flow in the reverse-voltage direction. All of the electric current from the source terminals 320 enters the body diodes 412 of the first semiconductor chips 410 (MOSFETs) via a circuit board 313b, conductive posts 515, and a source wiring layer 530 of printed circuit boards 500. All of the electric current entering the first semiconductor chips 410 (MOSFETs) flows through the body diodes 412, so that the first semiconductor chips 410 are heated and thus the characteristics of the semiconductor module are degraded.

By contrast, the semiconductor module 100 of the embodiment is able to reduce an electric current that flows through the body diodes 412 formed in the first semiconductor chips 410 (MOSFETs). This reduces the heat generation of the first semiconductor chips 410 (MOSFETs) and thus minimizes the degradation in the characteristics of the semiconductor module 100.

The disclosed technique makes it possible to minimize the degradation in the characteristics of semiconductor modules.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
   a drain board having a front surface and a back surface that receives an electric current supplied from outside;
   a laminated substrate including an insulating plate and a circuit board and being disposed on the front surface of the drain board, the insulating plate having a front surface and a back surface joined to the drain board, the circuit board being disposed on the front surface of the insulating plate;
   a first semiconductor chip including a switching element made of a wide-bandgap semiconductor and having a gate electrode and a source electrode on a front surface of the first semiconductor chip and a drain electrode on a back surface of the first semiconductor chip and being disposed on the front surface of the drain board, the drain electrode being electrically connected to the drain board;
   a second semiconductor chip including a diode element and having an anode electrode on a front surface of the second semiconductor chip and a cathode electrode on a back surface of the second semiconductor chip and being disposed between the first semiconductor chip and the laminated substrate on the front surface of the drain board, the cathode electrode being electrically connected to the drain board;
   a connecting member configured to electrically connect the source electrode of the first semiconductor chip and the circuit board and to electrically connect the anode electrode of the second semiconductor chip and the circuit board; and
   a source terminal disposed on the circuit board and configured to output the electric current, the electric current being controlled by the first semiconductor chip, to the outside.

2. The semiconductor module according to claim 1, wherein the first semiconductor chip includes a body diode connected in anti-parallel to the switching element.

3. The semiconductor module according to claim 2, wherein a resistance from the anode electrode to the cathode electrode in the second semiconductor chip is smaller than a resistance of the body diode of the first semiconductor chip.

4. The semiconductor module according to claim 1, wherein a voltage from the source terminal to the drain board is applied when a control signal supplied to the gate electrode of the first semiconductor chip is turned off from on.

5. The semiconductor module according to claim 4, wherein an electric current from the source terminal flows through the anode electrode of the second semiconductor chip via the circuit board and the connecting member.

6. The semiconductor module according to claim 1, wherein:
- the electric current supplied from the outside enters a central part of the back surface of the drain board; and
- the laminated substrate is disposed at a central part of the front surface of the drain board.

7. The semiconductor module according to claim 6, wherein:
- the first semiconductor chip is provided in plurality, the first semiconductor chips being arranged in a plurality of lines along a periphery of the front surface of the drain board; and
- the second semiconductor chip is provided in plurality, the second semiconductor chips being arranged in a plurality of lines between the laminated substrate and the first semiconductor chips.

8. The semiconductor module according to claim 1, wherein the connecting member includes a printed circuit board and conductive posts fixed to the printed circuit board.

9. The semiconductor module according to claim 1, wherein the switching element includes silicon carbide.

* * * * *